United States Patent

Fujiwara et al.

Patent Number: 5,534,109
Date of Patent: Jul. 9, 1996

[54] METHOD FOR ETCHING HGCDTE SUBSTRATE

[75] Inventors: Koji Fujiwara; Gen Sudo; Kenji Arinaga, all of Kawasaki, Japan

[73] Assignee: Fujitsu Limited, Kanagawa, Japan

[21] Appl. No.: 320,249

[22] Filed: Oct. 11, 1994

[30] Foreign Application Priority Data

Dec. 28, 1993 [JP] Japan ................... 5-336959

[51] Int. Cl.$^6$ ................ H01L 21/306; B44C 1/22
[52] U.S. Cl. .................... 156/643.1; 252/79.1
[58] Field of Search ............. 156/643.1, 659.11; 252/79.1

[56] References Cited

U.S. PATENT DOCUMENTS

| | | | |
|---|---|---|---|
| 4,465,552 | 8/1984 | Bobbio et al. | 156/643.1 |
| 4,838,984 | 6/1989 | Luttmer et al. | 156/643.1 |
| 5,000,820 | 3/1991 | Douglas | 156/643.1 |

FOREIGN PATENT DOCUMENTS 4-073733  3/1992  Japan .

OTHER PUBLICATIONS

"Novel $CH_4/H_2$ Metalorganic Reactive Ion Etching of $Hg_{1-x}Cd_xTe$" by Allen Semu et al., Appl. Phys. Lett., No. 59 (14), Sep. 30 1991, American Institute of Physics, pp. 1752–1754.

"Ion Beam Milling of $Cd_{0.2}Hg_{0.8}Te$" by M. A. Lunn et al., Journal of Crystal Growth 73 (1983), North–Holland, Amsterdam, pp. 379–384.

Primary Examiner—Charles L. Bowers, Jr.
Assistant Examiner—John A. McPherson
Attorney, Agent, or Firm—Staas & Halsey

[57] ABSTRACT

A method for etching an HgCdTe substrate selectively by dry etching. A substrate is selectively etched without damaging the substrate during a simple process in which the higher selectivity of an HgCdTe substrate versus a resist mask is obtainable. Removal of the resist mask after etching is easy. The etching gas contains molecules having a bond of nitrogen and hydrogen and is formed into plasma. An HgCdTe substrate is etched with a resist film as a mask by the plasma gas.

6 Claims, 8 Drawing Sheets

METHOD FOR ETCHING HGCDTE SUBSTRATE

BACKGROUND OF THE INVENTION

1. Field of the Invention

The present invention relates to a method for etching a mercury cadmium tellurium substrate (hereinafter referred to as an HgCdTe substrate), and more specifically to a method for etching an HgCdTe substrate selectively by dry etching.

2. Description of the Prior Art

HgCdTe is promising as a material for a highly sensitive infrared detector element. Further, in order to improve resolution of an infrared detector element, it is required to form separation grooves in a substrate for separating pixels so that electrons excited in a specific pixel by infrared irradiation do not pass into an adjacent pixel. For forming those separation grooves, it is demanded to establish etching technique of an HgCdTe substrate.

In dry etching of an HgCdTe substrate, mixed gas of $Ar+H_2$ or mixed gas of $H_2+CH_4$ has been heretofore used (reference documents: Appl. Phys. Lett., No. 59, p1752 (1991)).

In the etching using a mixed gas and a resist film 2a as a mask as shown in FIG. 1, however, it happens sometimes that the resist film 2a is etched during etching of an HgCdTe substrate 1a due to low selectivity of the HgCdTe substrate 1a versus the resist film 2a, and the substrate 1a to be protected is exposed and etched when forming the separation groove 5.

Further, the resist film 2a changes in quality and solidifies by irradiation with plasma of the mixed gas, and removal by an organic solvent becomes difficult. As a result, the resist is left on the surface of the substrate 1a, which makes processing thereafter difficult.

In order to avoid such a status, there is a method of using as an etching mask a two-layer film composed of an aluminum film 3 and a resist film 2b as shown in FIG. 2 to obtain a separation groove 5b. Further an insulating film such as a SiN film 4 as an etching mask as shown in FIG. 3 (Described in Japanese unexamined publication (Kokai) Hei 4-073733) to obtain a separation groove 5c is employed.

However, a forming process for the aluminum film 3 and the insulating film 4, and in addition, a patterning process for these films or the like are required for forming such an etching mask. Hence, simplification of the process cannot be achieved.

Further, although change in quality and solidification of the resist mask are avoidable in the case that the resist film as a mask is used in sputter etching using Ar gas (reference documents: Journal of Crystal Growth 73 (1985) 379–384) in order to simplify the process, there arises a risk of causing damage on the substrate. When the substrate is damaged, a leak current passes through a PN junction. Hence, the sensitivity of the infrared detector element may be lowered, or a pixel separation may become insufficient.

SUMMARY OF THE INVENTION

It is an object of the present invention to provide a dry etching method in that the higher selectivity of an HgCdTe substrate versus a resist mask is obtainable, removal of the resist mask after etching is easy, and the substrate can be selectively etched in a simple process and without damaging the substrate.

The inventor of the present application has found that, when the HgCdTe substrate is etched selectively with the resist mask as using a plasma gas containing molecules having coupling of nitrogen and hydrogen, e.g., $NH_3$, the resist mask is neither changed in quality nor solidified so that it can be removed easily by an organic solvent after etching.

Further, the higher selectivity of the HgCdTe substrate versus the resist mask, which is 4 or higher, has been able to be secured.

According to a method for etching a HgCdTe substrate of the present invention, it is possible to form a mask simply by coating resist, exposing and developing a resist film.

Further, since a plasma gas containing molecules having coupling of nitrogen and hydrogen is used as etching gas to etch the HgCdTe substrate with a resist mask, the higher selectivity of the HgCdTe substrate versus the resist mask is obtainable, and removal of the resist mask after etching becomes easy.

Furthermore, it is possible to apply dry etching other than sputter etching, in which is used the above-mentioned etching gas that has been formed into plasma by supplying microwave electric power with magnetic field, supplying microwave electric power simply or supplying radio frequency electric power. This application leads to preventing the HgCdTe substrates from sustaining damage through avoiding usage of plasma gas with high energy.

DESCRIPTION OF THE PREFERRED EMBODIMENT

Next, a method for etching an HgCdTe substrate according to an embodiment of the present invention will be described with reference to the drawings.

Figure 5:
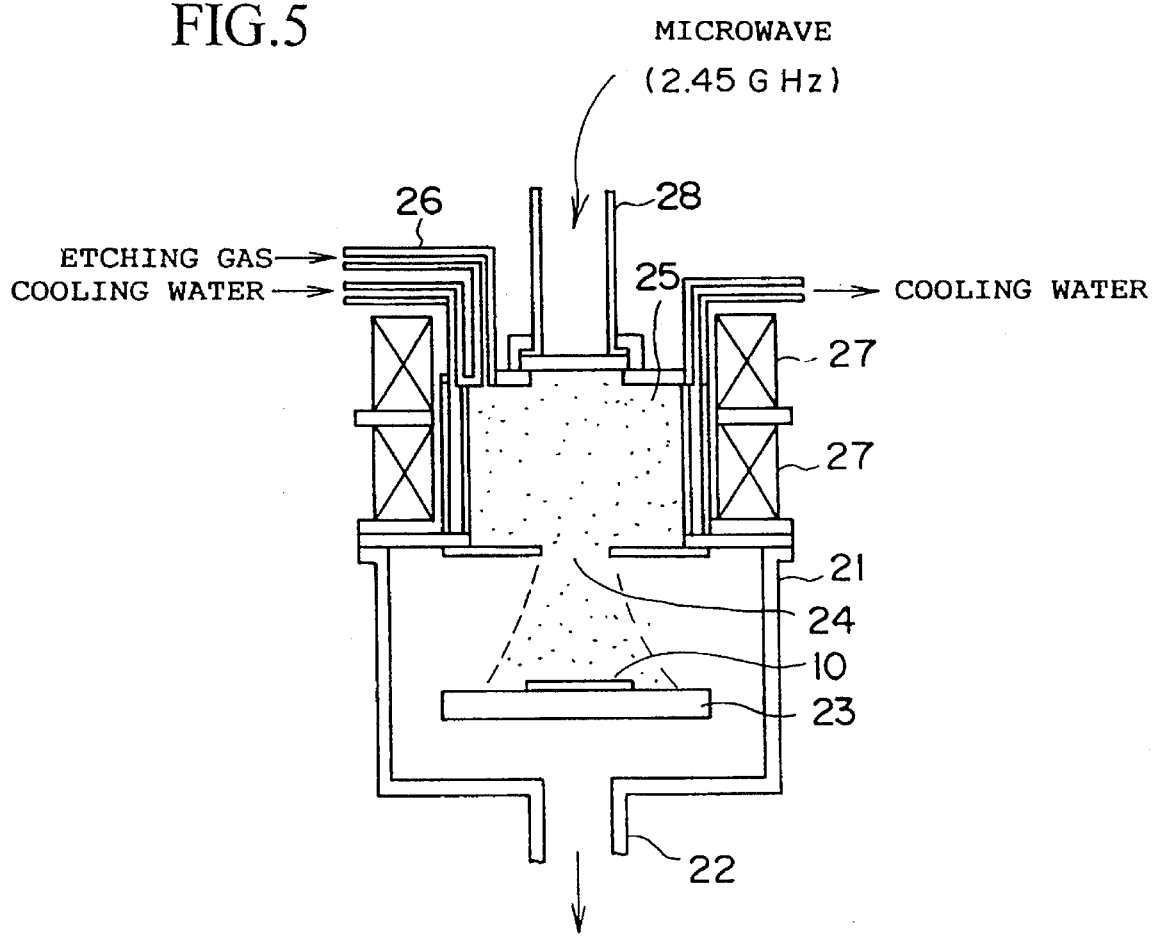
FIG. 5 is a side view showing a structure of an ECR plasma etching apparatus used in an etching method according to an embodiment of the present invention.

(1) Description of an electron cyclotron resonance (ECR) plasma etching apparatus used in a method for etching an HgCdTe substrate according to an embodiment of the present invention FIG. 5 is a side view showing a structure of an ECR plasma etching apparatus.

In FIG. 5, a reference numeral 25 represents a plasma generating chamber for forming plasma by ECR, a waveguide 28 is connected to the plasma generating chamber 25, and the plasma generating chamber 25 operates as a cavity resonator.

26 represents a gas introduction pipe for introducing the etching gas such as $NH_3$ gas into the plasma generating chamber 25.

27 represents an electromagnetic coil provided in an outer circumferential portion of the plasma generating chamber 25 and makes electrons to perform cyclotron motion in the plasma generating chamber 25.

28 represents a waveguide for guiding a microwave having a frequency of 2.45 GHz into the plasma generating chamber 25.

In the plasma generating chamber 25, electrons are made to start a circular motion by applying a magnetic field of intensity of 875 Gauss generated with the electromagnetic coil 27, and frequency of the circular motion and the frequency of the microwave are made to coincide with each other so as to give rise to resonance absorption, thereby to have electrons absorb energy efficiently. The energy of these electrons is given to etching gas molecules so as to form the etching gas into plasma. Such electric power as supplied to the etching gas is referred to as microwave electric power with magnetic field.

Further, 21 represents an etching chamber connected to the plasma generating chamber 25 through a conduction hole 24, and plasma generated in the plasma generating chamber 25 is introduced into the downstream etching chamber 21 through the conduction hole 24.

22 represents an exhaust port provided in the etching chamber 21, and excessive etching gas and reacted gas are exhausted therethrough to the outside of the etching chamber 21.

23 represents a substrate placing table provided in the etching chamber 21 for placing a HgCdTe substrate 10 to be etched thereon.

This ECR plasma etching apparatus has such features that the substrate sustains hardly the damage since the energy of ions themselves in the plasma is as small as 20 to 30 eV, and that the growth rate is also high since the ion density is larger as compared with a sputter apparatus. Further, there is also such a feature that etching can be made without heating the substrate.

When the HgCdTe substrate 10 is etched, the HgCdTe substrate 10 is placed first on the substrate placing table 23 in the etching chamber 21.

Then, $NH_3$ gas is introduced into the plasma generating chamber 25 through the gas introduction pipe 26, and the microwave is introduced into the plasma generating chamber 25 through the waveguide 28 at the same time. The electrons that have been put in cyclotron motion in advance by applying the magnetic field of intensity of 875 Gauss generated with the electromagnetic coil 27 resonates with the microwave and acquires high energy, and collides with $NH_3$ gas and supplies the energy thereof to the $NH_3$ gas, thus forming the $NH_3$ gas into plasma.

The $NH_3$ gas formed into plasma passes to the downstream etching chamber 21 through the conduction hole 24, and etches the HgCdTe substrate 10.

Figure 6:
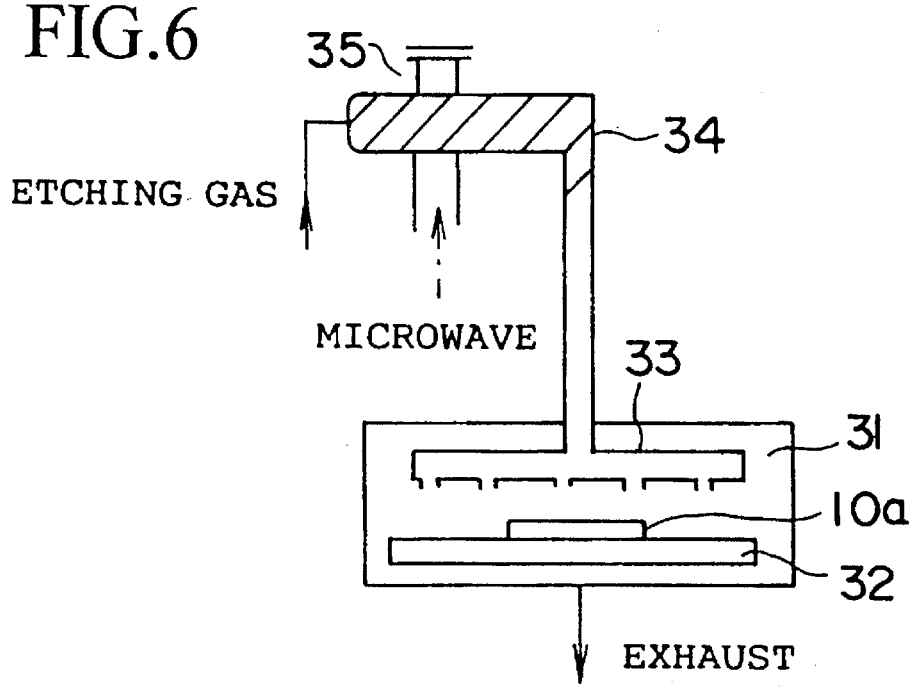
FIG. 6 is a side view showing a structure of a plasma chamber separation type plasma etching apparatus used in an etching method according to an embodiment of the present invention.

Besides, an ECR plasma etching apparatus is used in the foregoing. In this ECR plasma etching apparatus, microwave electric power with magnetic field is supplied so as to form etching gas into plasma and etching is performed by the plasma gas. But a plasma chamber separation type etching apparatus may also be used. In this etching apparatus, microwave electric power having the same frequency as the above is simply supplied so as to form the etching gas in a plasma generating chamber 34 into plasma and the plasma gas is introduced into an etching chamber 31 so as to etch a substrate 10a as shown in FIG. 6. Besides, in FIG. 6, another reference numeral 32 represents a placing table for the substrate 10a, 33 represents a gas nozzle and 35 represents a waveguide.

Figure 7:
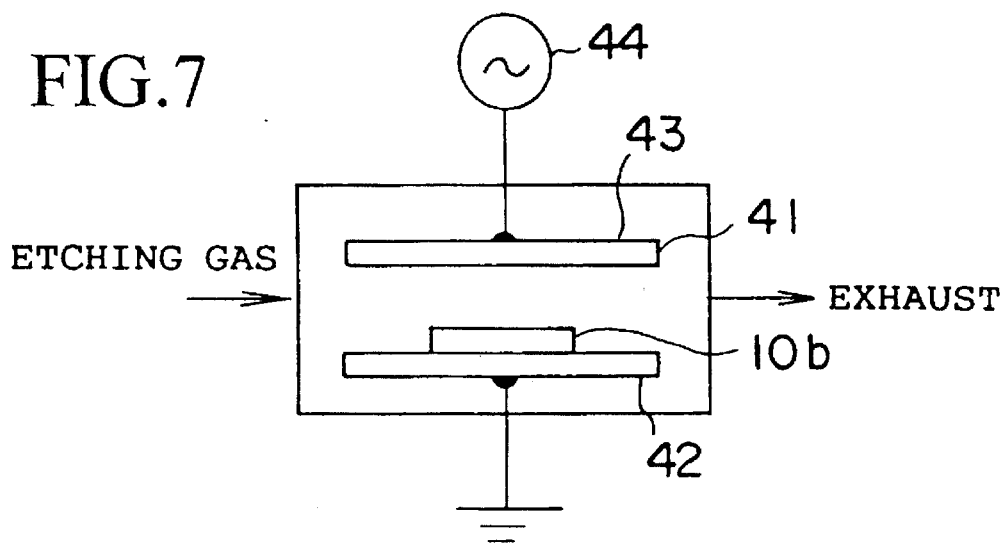
FIG. 7 is a side view showing a structure of a parallel plate type plasma etching apparatus used in an etching method according to an embodiment of the present invention.
Figure 6:
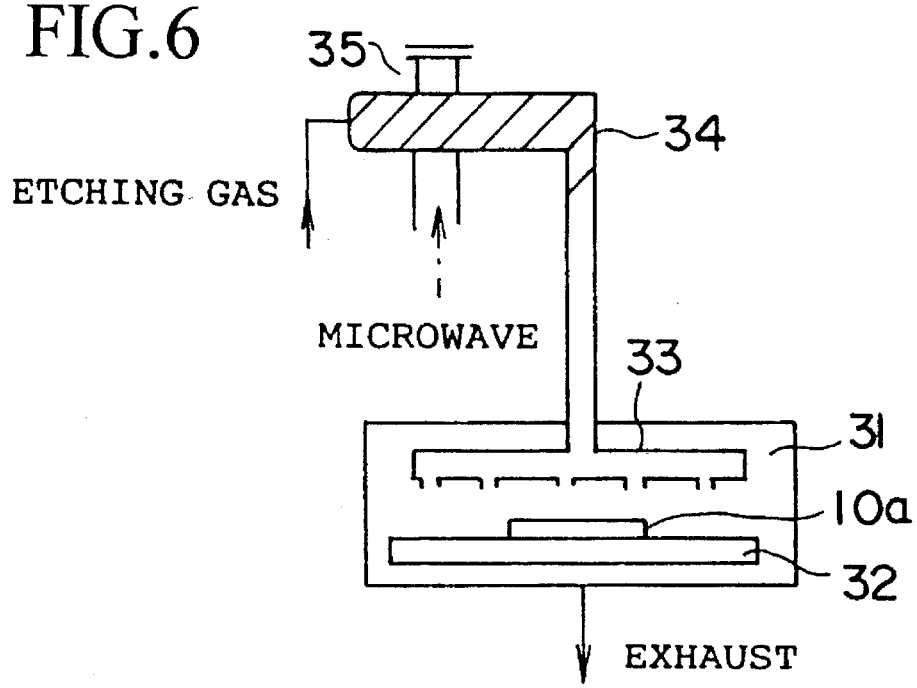
Figure 7:
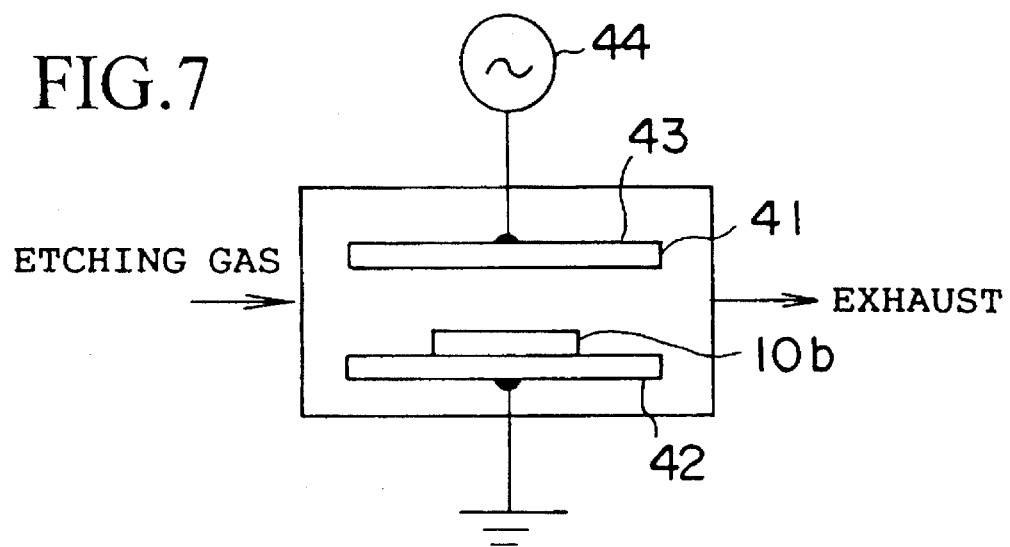

Further, a parallel plate type etching apparatus such as shown in FIG. 7 other than the sputter etching apparatus may also be used. In this parallel plate type etching apparatus, radio frequency electric power (RF electric power) having a frequency of 13.56 MHz is supplied between opposed electrodes 42 and 43, thereby to form the etching gas in an etching chamber 41 into plasma so as to etch a substrate 10b. Besides, another reference numeral 44 in the figure represents a radio frequency power source.

(2) Description of a method for etching an HgCdTe substrate according to an embodiment of the present invention FIG. 4A to FIG. 4E are sectional views showing a method for etching an HgCdTe substrate according to an embodiment of the present invention. An ECR plasma etching apparatus shown in FIG. 5 is used as the etching apparatus.

First, resist having viscosity of 30 cp is coated at 3,000 rpm onto the HgCdTe substrate 10 by a spin coating method. Then, the coated resist is hardened by baking so as to form a resist film having a film thickness of 1.4 µm. Besides, a positive type photoresist (Trade name: OFPR-800 made by Tokyo Ohka) for instance is used as the resist.

Figure 1:
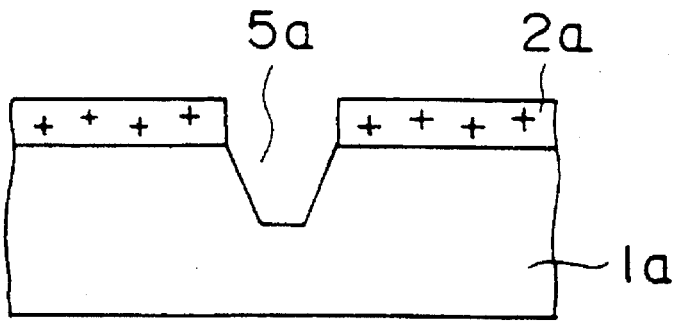
FIG. 1 is a sectional view showing a part of an etching mask composed of a resist film according to a conventional example.
Figure 2:
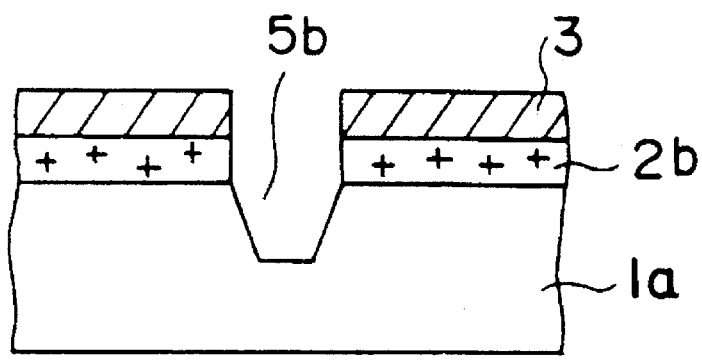
FIG. 2 is a sectional view showing a part of an etching mask composed of a two-layer film of a resist film/an aluminum film according to a conventional example.
Figure 3:
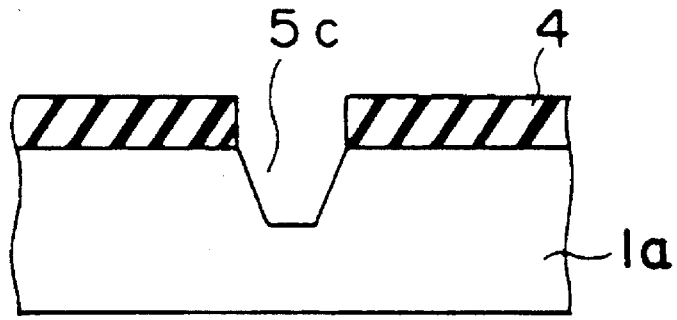
FIG. 3 is a sectional view showing a part of an etching mask composed of a silicon nitride film according to a conventional example.
Figure 4A:
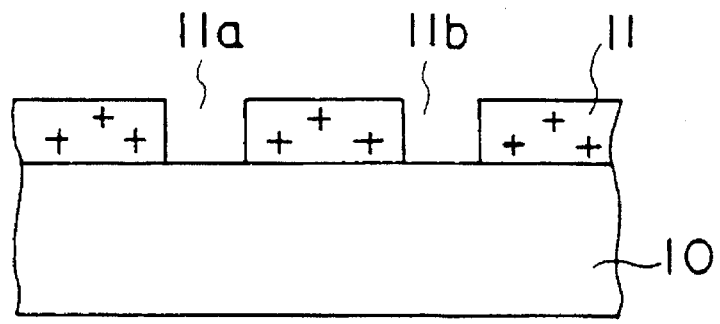
FIG. 4A to FIG. 4E are sectional views showing a method for etching an HgCdTe substrate according to an embodiment of the present invention.

Then, as shown in FIG. 4A, the resist film is exposed selectively using an photo mask, and thereafter unnecessary portions are removed by soaking the substrate into a developer, thus completing a resist mask 11 having openings 11a and 11b.

Next, the HgCdTe substrate 10 with the resist mask 11 is placed on the substrate placing table 23 in the etching chamber 21 of the ECR plasma etching apparatus. Then, the interior of the etching chamber 21 and the interior of the plasma generating chamber 25 are exhausted.

After predetermined pressure is reached, $NH_3$ gas is introduced into the plasma generating chamber 25 and the pressure is held at $1\times10^{-4}$ to $1\times10^{-3}$ Torr. In the case of the present embodiment, the pressure is held at $2.8\times10^{-3}$ Torr for instance. Furthermore, a microwave of electric power at 140 W is introduced into the plasma generating chamber 25. With this, $NH_3$ gas is formed into plasma through ECR. The plasma gas passes through the conduction hole 24 into the etching chamber 21 and reaches above the HgCdTe substrate 10, thus starting etching.

Figure 4B:
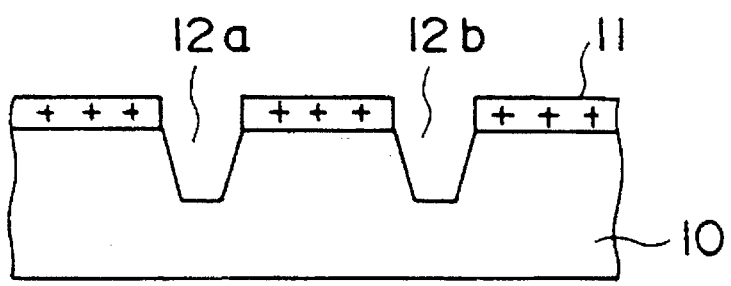

After the lapse of approximately 10 minutes, the HgCdTe substrate 10 is etched selectively through the openings 11a and 11b of the resist mask 11, and separation grooves 12a and 12b are formed as shown in FIG. 4B. Since the energy of ions themselves in the plasma is small at this time, the substrate 10 sustains hardly damages. Further, since $NH_3$ gas is used as the etching gas, the resist mask 11 is neither changed in quality nor solidified.

Figure 4C:
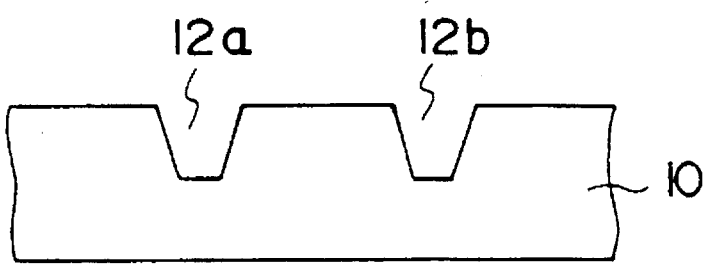

After etching, the resist mask 11 is removed by acetone as shown in FIG. 4C. At this time, since the resist mask has been neither changed in quality nor solidified, it is dissolved easily and is removed completely.

Figure 4D:
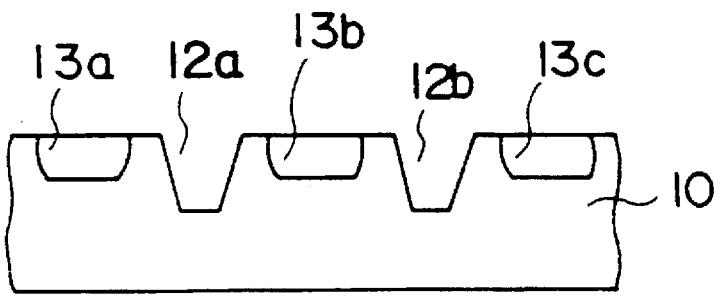

Thereafter, as shown in FIG. 4D, impurities giving a opposite conduction type against a conduction type of the HgCdTe substrate 10 are introduced selectively at projected portions formed among separation grooves 12a to 12b, thus forming PN junctions 13a to 13c.

Figure 4E:
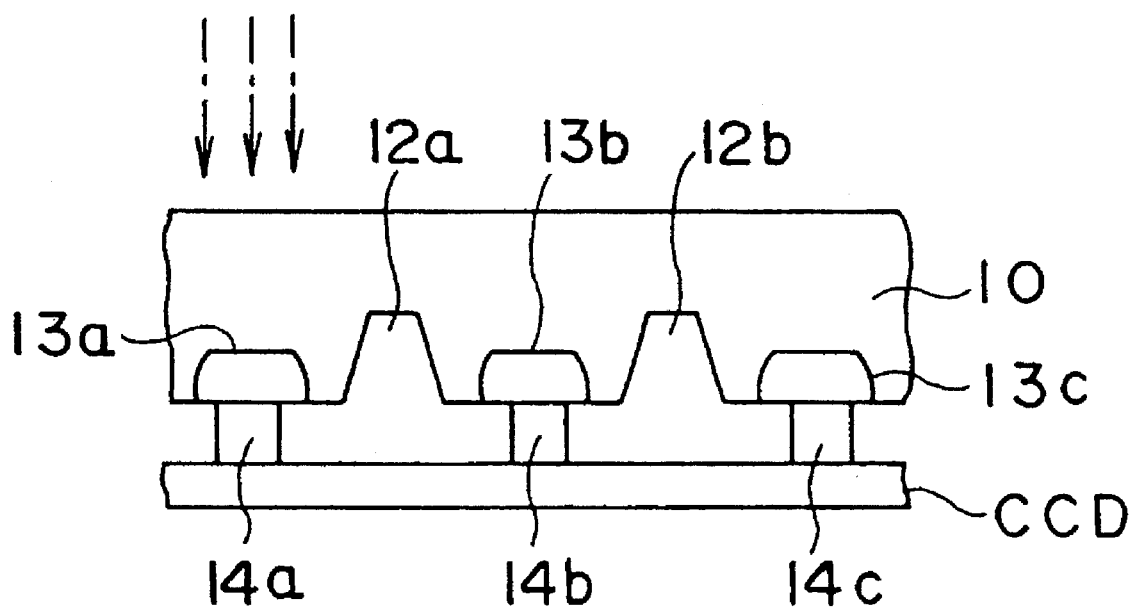

Then, as shown in FIG. 4E, an infrared detector element is completed by connecting outgoing electrodes 14a to 14c of a charge coupled device (CCD) and PN junctions 13a to 13c to one another.

(3) Description of result of evaluation on an etching method according to an embodiment of the present invention Next, the results of etching described above will be described.

Figure 8A:
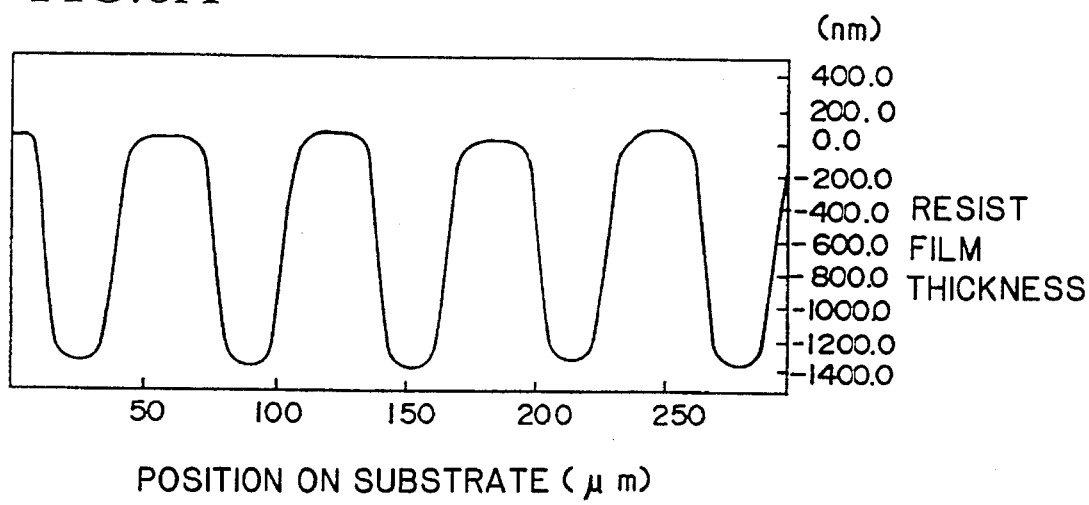
FIG. 8A to FIG. 8C are characteristic diagrams showing selectivity of etching based on an etching method according to an embodiment of the present invention.
Figure 8B:
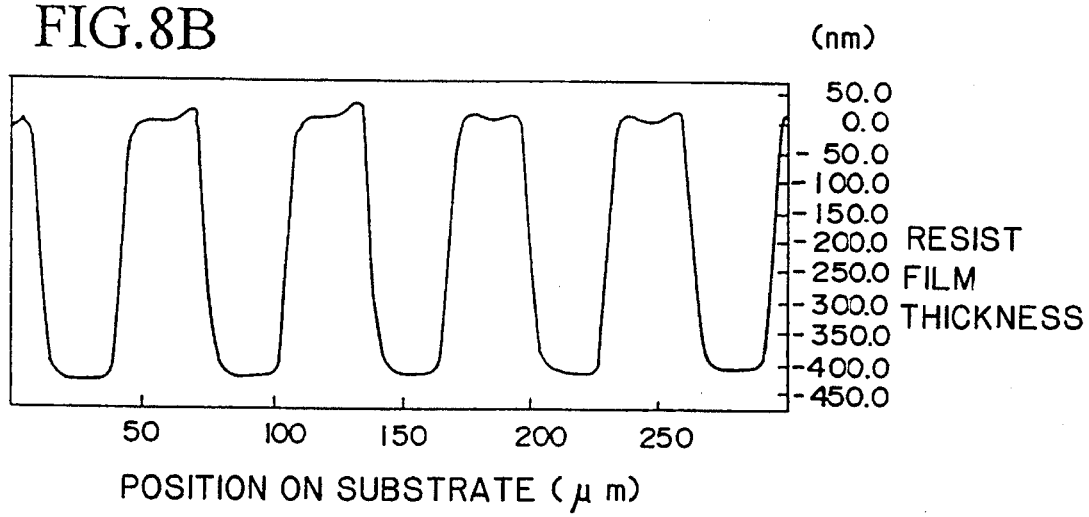
Figure 8C:
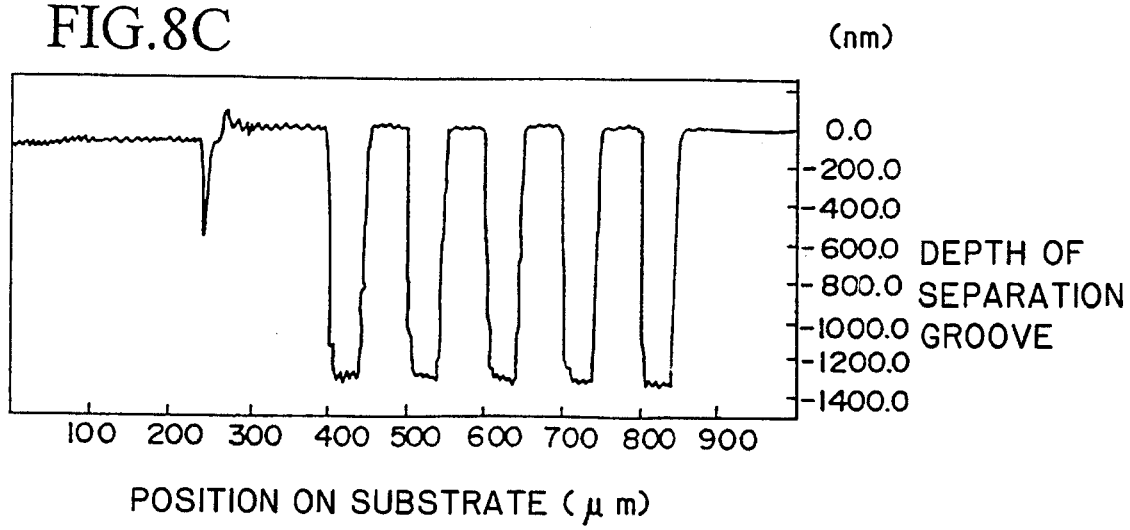

FIG. 8A to FIG. 8C are characteristic diagrams showing the state of the change in the film thickness of the resist mask before and after etching and the depth of the separation groove formed on the HgCdTe substrate after etching.

FIG. 8A shows the initial film thickness of the etching mask before etching, and FIG. 8B shows the film thickness of the resist mask left after etching. In both figures, the axis of abscissas indicates a position coordinate (μm) with an optional position on the HgCdTe substrate as a reference, and the axis of ordinates indicates a film thickness (nm) of the resist mask measured with the surface of the resist mask as a reference.

Specimens used in experiments were formed under the same forming conditions of the resist mask as those in the embodiment described in the paragraph (2) and through the same process as that in the embodiment described in the paragraph (2). However, etching of the resist mask was made for 30 minutes as being different from that embodiment. The film thickness of the resist mask formed in the specimen was measured by tracing the surface with a needle and recording unevenness at that time.

FIG. 8C shows the depth of a separation groove formed by etching on the HgCdTe substrate. The axis of abscissas indicates a position coordinate (μm) with an optional position on the HgCdTe substrate as a reference, and the axis of ordinates indicates the depth (nm) from the substrate surface.

Specimens used in experiments were produced under the same etching conditions of the HgCdTe substrate as those in the embodiment described in the paragraph (2) and through the same process as that in the embodiment in the paragraph (2). The depth of the separation groove formed in the specimen was measured by tracing the surface thereof with a needle and recording the unevenness at that time.

According to the results of experiments, the remaining film thickness of the resist mask after etching is shown at approximately 400 nm from the observation of FIG. 8B. This means that etching was made by approximately 1,000 nm for 30 minutes for the initial film thickness of 1.400 nm of the resist mask shown in FIG. 8A. Thus, the etching rate of the resist mask 11 is approximately 33 nm per minute.

Further, the depth of the separation groove of the HgCdTe substrate 10 is shown at approximately 1,350 nm from the observation of FIG. 8C. Thus, it means that the substrate has been etched by 1,350 nm for 10 minutes, and the etching rate of the HgCdTe substrate 10 is approximately 135 nm per minute.

When the selectivity is computed taking the ratio of the etching rate of the HgCdTe substrate 10 versus the etching rate of the resist mask 11 from these data, the selectivity of 4 or higher is obtained.

Figure 9A:
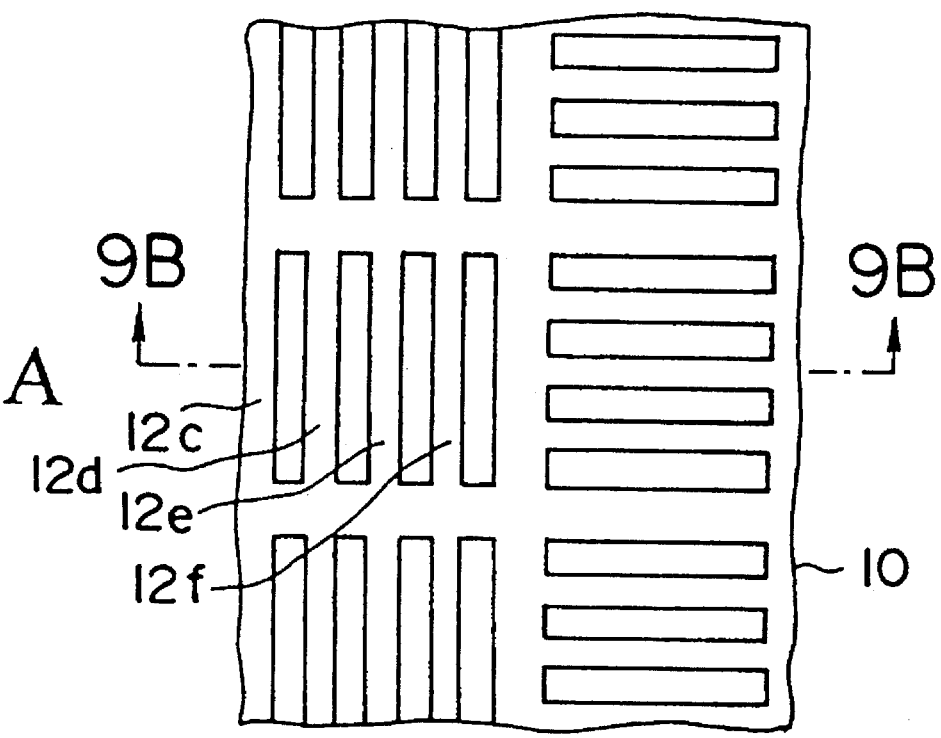
FIG. 9A is a plan view showing a removed state of a resist mask exposed to etching gas according to an embodiment of the present invention.
Figure 9B:
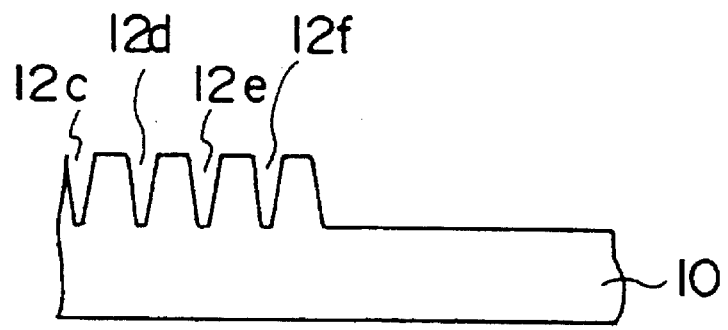
FIG. 9B is a sectional view taken on line A—A in FIG.9A.

Furthermore, the removed state of the resist mask after soaking in acetone the resist mask 11 exposed to the plasma of the etching gas is shown in FIG. 9A and FIG. 9B. FIG. 9A is a plan view obtained by depicting a photograph, and FIG. 9B is a sectional view taken along a line 9A—9A in FIG. 9A. In these figures, 10 represents a HgCdTe substrate, and 12c to 12f represent separation grooves.

Besides, the removed state of the resist mask after soaking in acetone a resist mask exposed to conventional etching gas formed into plasma was investigated for comparison. The result thereof is shown in FIG. 10A and FIG. 10B.

Figure 10A:
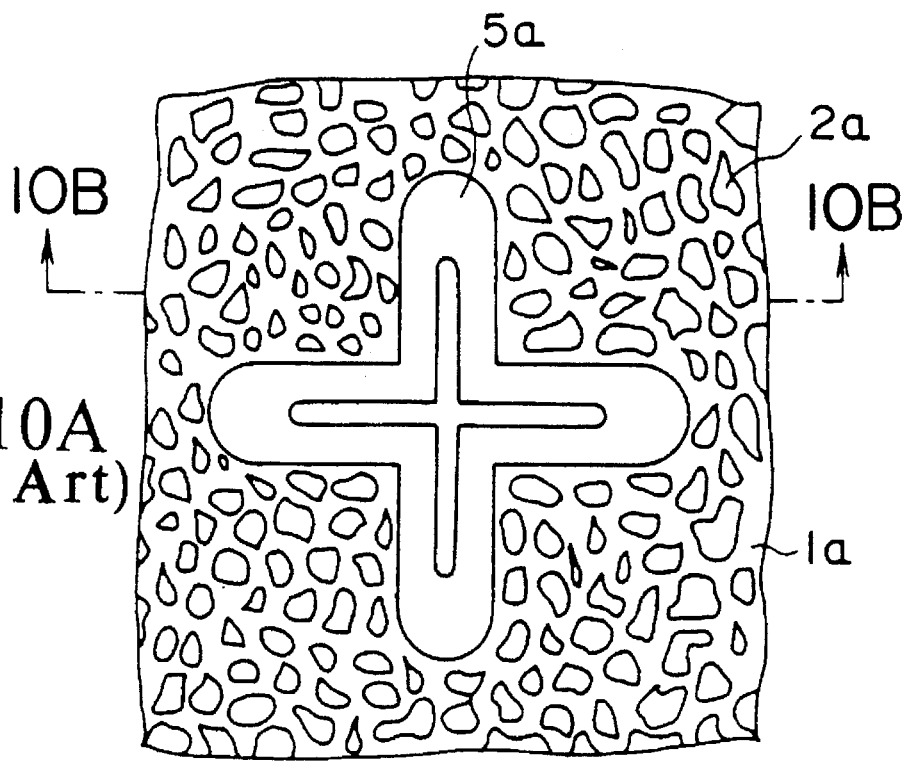
FIG. 10A is a plan view showing a removed state of a resist mask exposed to etching gas according to a comparison example.
Figure 10B:
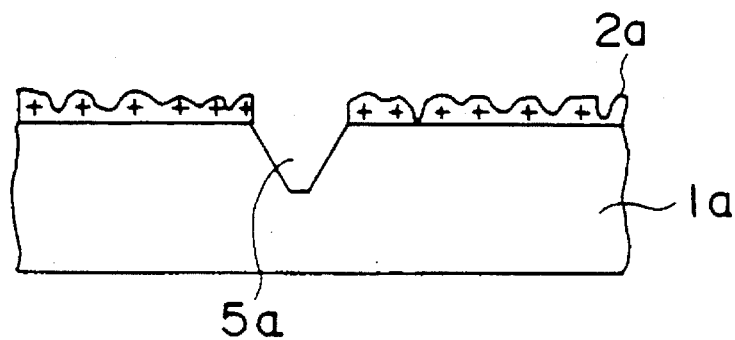
FIG. 10B is a sectional view taken on line B—B in FIG. 10A.

FIG. 10A is a plan view obtained by depicting a photograph. FIG. 10B is a sectional view taken along a line 10B—10B in FIG. 10A. In these figures, 1a represents an HgCdTe substrate, 2a represents a resist film and 5a represents a separation groove.

From the result of observation described above, it is seen that the resist mask 11 is removed completely by acetone processing according to the etching method in the embodiment of the present invention (see FIG. 4C). This is conceivable that change in quality and solidification of the resist mask 11 have been prevented.

On the other hand, a considerable amount of resist film 2a still exists (see FIG. 10B) when acetone processing is performed in the conventional example.

According to an etching method in the embodiment of the present invention, since a resist film is used as an etching mask as described above, it is possible to form a mask simply by coating resist, exposing and developing a resist film.

Further, since gas obtained by forming ammonia ($NH_3$) into plasma is used, the higher selectivity of the HgCdTe substrate 10 versus the resist mask 11 is obtainable, and the resist mask 11 after etching can be easily removed.

Furthermore, the HgCdTe substrate 10 is etched by ECR etching using etching gas formed into plasma by supplying microwave electric power with magnetic field. With this, it is possible to prevent introduction of damage into the HgCdTe substrate 10 through avoiding usage of plasma gas with high energy.

Besides, $NH_3$ gas is used as the etching gas in the above-mentioned embodiment, but it is also possible to use another etching gas containing molecules including N-H bonds such as methylamine ($CH_3NH_2$) and dimethylamine (($CH_3)_2NH$).

Further, not only the above-mentioned gas is used independently, but also mixed gas of the above-mentioned gas and another gas, e.g., rare gas such as Ar can be used.

In these cases, it is possible to secure the higher selectivity of the HgCdTe substrate 10 versus the resist mask 11, and to prevent change in quality and solidification of the resist mask 11 due to reaction with the etching gas.

Further, microwave electric power with magnetic field is supplied in order to form the etching gas into plasma, but microwave electric power or RF electric power may also be supplied simply. Further, it is possible to apply dry etching other than sputter etching using these gas formed into plasma. Since it is neither required to use plasma gas of high energy in these cases, it is possible to prevent introduction of damage into the HgCdTe substrate.

What is claimed is:

1. A method for etching a mercury cadmium tellurium substrate comprising the steps of:

a) forming a gas containing molecules having a bond of nitrogen and hydrogen into a plasma; and b) etching the mercury cadmium tellurium substrate using the plasma as an etching gas.

2. The method for etching a mercury cadmium tellurium substrate according to claim 1, further comprising the step of selectively etching the mercury cadmium tellurium substrate with a resist film formed on the mercury cadmium tellurium substrate as a mask by the plasma gas.

3. The method for etching a mercury cadmium tellurium substrate according to claim 1, wherein the gas containing molecules having a bond of nitrogen and hydrogen is selected from the group consisting of methylamine ($CH_3NH_2$), dimethylamine (($CH_3)_2NH$) and ammonia ($NH_3$).

4. The method for etching a mercury cadmium tellurium substrate according to claim 1, wherein said step (a) comprises forming the gas into plasma by supplying microwave electric power with a magnetic field to the etching gas containing molecules having a bond of nitrogen and hydrogen.

5. The method for etching a mercury cadmium tellurium substrate according to claim 1, wherein said step (a) comprises forming the gas into plasma by supplying microwave electric power to the gas containing molecules having a bond of nitrogen and hydrogen.

6. The method for etching a mercury cadmium tellurium substrate according to claim 1, wherein said step (a) comprises forming the gas into plasma by supplying radio frequency electric power to the etching gas containing molecules having a bond of nitrogen and hydrogen.

* * * * *